United States Patent
Park et al.

(10) Patent No.: US 8,804,083 B2
(45) Date of Patent: Aug. 12, 2014

(54) LIQUID CRYSTAL DISPLAY DEVICE

(75) Inventors: Kyung-Ho Park, Cheonan-si (KR); Bo-Yeong Kim, Asan-si (KR); Jae-Won Kim, Asan-si (KR); Byoung-Sun Na, Hwaseong-si (KR); Hyung-Jun Park, Seongnam-si (KR); Dong-Hyun Yoo, Asan-si (KR); Kye-Uk Lee, Hwaseong-si (KR)

(73) Assignee: Samsung Display Co., Ltd. (KR)

( * ) Notice: Subject to any disclaimer, the term of this patent is extended or adjusted under 35 U.S.C. 154(b) by 159 days.

(21) Appl. No.: 13/592,525

(22) Filed: Aug. 23, 2012

(65) Prior Publication Data

US 2013/0135572 A1 May 30, 2013

(30) Foreign Application Priority Data

Nov. 30, 2011 (KR) .......................... 10-2011-0126671

(51) Int. Cl.
*G02F 1/1343* (2006.01)

(52) U.S. Cl.
USPC .............................. 349/143; 349/144; 349/146

(58) Field of Classification Search
CPC ................... G02F 1/134336; G02F 1/133707; G02F 1/1393; G02F 2001/134345
USPC .......................................... 349/143, 144, 146
See application file for complete search history.

(56) References Cited

U.S. PATENT DOCUMENTS

| 8,427,621 B2 * | 4/2013 | Jung et al. ...................... 349/144 |
| 2012/0162559 A1 * | 6/2012 | Kim et al. ........................ 349/42 |
| 2013/0083263 A1 * | 4/2013 | Kim et al. ........................ 349/38 |

* cited by examiner

*Primary Examiner* — Mike Qi

(74) *Attorney, Agent, or Firm* — Cantor Colburn LLP

(57) ABSTRACT

A liquid crystal display device includes upper and lower pixels; gate lines in electrical connection with the adjacent pixels and extending in a row direction, and data lines which cross the gate lines; and a reference voltage line including a vertical portion which passes through the adjacent pixels, and horizontal portions which alternately extend from the vertical portion. Each of the adjacent pixels includes first and second thin film transistors (TFTs) each in electrical connection with a gate line and a data line which correspond to a respective pixel; and a pixel electrode including a first subpixel electrode in connection with an output terminal of the first TFT, and a second subpixel electrode in connection with an output terminal of the second TFT. The horizontal portions of the reference voltage line are in electrical connection with the second subpixel electrodes of the adjacent pixels.

24 Claims, 8 Drawing Sheets

1

LIQUID CRYSTAL DISPLAY DEVICE

This application claims priority to Korean Patent Application Serial No. 10-2011-0126671 filed on Nov. 30, 2011, and all the benefits accruing therefrom under 35 U.S.C. §119(a), the entire disclosure of which is hereby incorporated by reference.

BACKGROUND (1) Field

The invention relates to a liquid crystal display device.

(2) Description of the Related Art

A liquid crystal display device, one of the most widely used flat panel display devices, includes two display panels, on which are formed electric field-generating electrodes such as pixel electrodes and common electrodes, and a liquid crystal layer filled between the display panels.

An electric field is generated in the liquid crystal layer by applying a voltage to the electric field-generating electrodes, and the generated electric field changes alignment of liquid crystal molecules in the liquid crystal layer. The change in alignment of liquid crystal molecules makes it possible to control the polarization of incident light, thereby displaying images using the light.

A liquid crystal display device includes a switching element connected to a pixel electrode, and a plurality of signal lines (such as a gate line and a data line) for applying a voltage to the pixel electrode by controlling the switching element.

Among liquid crystal display devices, a liquid crystal display device based on a vertically aligned mode, which aligns the major axis of liquid crystal molecules to be perpendicular to a display panel when no electric field is applied, is in the limelight because the vertically aligned mode has a relatively high contrast ratio and a wide viewing angle.

However, for the vertically aligned mode-based liquid crystal display device, side visibility may be lower than front visibility. To improve visibility of the vertically aligned mode-based liquid crystal display device, one pixel in the liquid crystal display device is divided into a high subpixel to which is applied a relatively high voltage and a low subpixel to which is applied a relatively low voltage, to adjust transmittance thereof, thereby improving the visibility.

SUMMARY

One or more exemplary embodiment of the invention improves visibility of a liquid crystal display device with use of a reference voltage line connected to a voltage-dividing switching element for adjusting a voltage level of a low subpixel to which is applied a relatively low voltage.

One or more exemplary embodiment of the invention suppresses occurrence of an electrical short between a reference voltage line and an adjacent data line by optimizing a structure and a layout of the reference voltage line.

In one exemplary embodiment of the invention, there is provided a liquid crystal display device including adjacent upper and lower pixels; gate lines in electrical connection with the pixels and extending in a row direction; data lines which cross the gate lines; and a reference voltage line including a vertical portion which passes through the pixels, and horizontal portions which alternately extend from the vertical portion. Each of the pixels includes first and second thin film transistors ("TFTs") each in electrical connection with a gate line and a data line which correspond to a respective pixel; and a pixel electrode including a first subpixel electrode in connection with an output terminal of the first TFT and a second subpixel electrode in connection with an output terminal of the second TFT. The horizontal portions of the reference voltage line are in electrical connection with the second subpixel electrodes of the pixels.

In accordance with another exemplary embodiment of the invention, there is provided a display device including a substrate; a pixel on the substrate; a gate line in electrical connection with the pixel and extending in a row direction; a data line which crosses the gate line; and a reference voltage line. The pixel includes first and second TFTs each in electrical connection with the gate line and the data line; and a pixel electrode including a first subpixel electrode in connection with an output terminal of the first TFT and a second subpixel electrode in connection with an output terminal of the second TFT, a horizontal side of the pixel electrode in the row direction being longer than a vertical side of the pixel electrode. The reference voltage line includes a vertical portion which passes through an area including the pixel electrode, and a horizontal portion which extends from the vertical portion along a perimeter of a horizontal side of the pixel electrode and is in electrical connection with the second subpixel electrode.

In accordance with further another exemplary embodiment of the invention, there is provided a liquid crystal display device including a first substrate; a second substrate which faces the first substrate; a liquid crystal layer between the first and second substrates and including liquid crystal molecules; a plurality of gate lines on the first substrate and extending in a row direction; a plurality of data lines on a first insulating layer which is on the first substrate, the data lines extending in a column direction; pixel electrodes on a second insulating layer which is on the first insulating layer, between adjacent gate lines among the plurality of gate lines and between adjacent data lines among the plurality of data lines, each of the pixel electrodes including first and second-area electrodes; switching elements which alternately connect the pixel electrodes in a same row to the data lines adjacent to the pixel electrodes in the same row, each of the switching elements including at least two TFTs, sources and gates of the TFTs are in connection with data lines and gate lines corresponding to the TFTs, respectively, and drains of the TFTs are in connection with first and second-area electrodes corresponding to the TFTs, respectively; a reference voltage line on the second insulating layer, the reference voltage line including vertical lines which extend in the column direction and in predetermined areas of the pixel electrodes, and horizontal lines in connection with the second-area electrodes along perimeters between the pixel electrodes and alternately extending in the row direction from the vertical lines; and a common electrode facing the pixel electrodes and on the second substrate.

In accordance with yet another exemplary embodiment of the invention, there is provided a liquid crystal display device including a first substrate; a second substrate which faces the first substrate; a liquid crystal layer between the first and second substrates and including liquid crystal molecules; a plurality of gate lines on the first substrate and extending in a row direction; a plurality of data lines on a first insulating layer which is on the first substrate, the data lines extending in a column direction; pixel electrodes on a second insulating layer which is on the first insulting layer, between adjacent gate lines among the plurality of gate lines and between adjacent data lines among the plurality of data lines, a horizontal side of the pixel electrodes in the row direction being longer than a vertical side of the pixel electrodes in the column direction, each of the pixel electrodes including first and second-area electrodes; switching elements which connect the pixel electrodes in a same row to the data lines adjacent to the pixel electrodes in the same row, each of the switching elements including at least two TFTs, sources and gates of the TFTs in connection with data lines and gate lines corresponding to the TFTs, respectively, and drains of the TFTs in connection with the first and second-area electrodes corresponding to the TFTs, respectively; a reference voltage line on the second insulating layer, the reference voltage line including vertical lines which extend in the column direction and in predetermined areas of the pixel electrodes, and horizontal lines in connection with the second-area electrodes along perimeters between the pixel electrodes and extending in the row direction; and a common electrode which faces the pixel electrodes and on the second substrate.

In accordance with still another exemplary embodiment of the invention, there is provided a display device including a substrate; a pixel on the substrate; a gate line in electrical connection with the pixel and extending in a row direction, and a data line which crosses the gate line. The pixel includes first and second TFTs in electrical connection with the gate line and the data line; and a pixel electrode including a first subpixel electrode in connection with an output terminal of the first TFT and a second subpixel electrode in connection with an output terminal of the second TFT. The display device includes a reference voltage line including a vertical portion which passes through an area including the pixel electrode, a first horizontal portion which extends from the vertical portion in a first direction in the row direction and in electrical connection with the second subpixel electrode, and a second horizontal portion which extends in a direction opposite to the first direction.

BRIEF DESCRIPTION OF THE DRAWINGS

The above and other features and advantages of one or more exemplary embodiments of the invention will be more apparent from the following description taken in conjunction with the accompanying drawings, in which.

DETAILED DESCRIPTION

Figure 1:
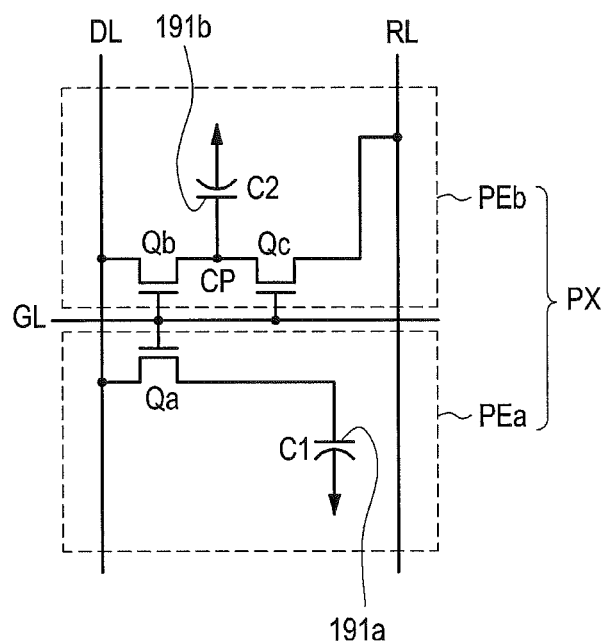
FIG. 1 illustrates an equivalent circuit diagram of an exemplary embodiment of one pixel in a liquid crystal display device according to the invention.

Exemplary embodiments of the invention will be described in detail below with reference to the accompanying drawings. This invention may, however, be embodied in many different forms and should not be construed as limited to the exemplary embodiments set forth herein. Rather, these embodiments are provided so that this disclosure will be thorough and complete, and will fully convey the scope of the invention to those skilled in the art. In the drawings, the size and relative sizes of layers and regions may be exaggerated for clarity.

It will be understood that when an element or layer is referred to as being "on" or "connected to" another element or layer, the element or layer can be directly on or connected to another element or layer or intervening elements or layers. In contrast, when an element is referred to as being "directly on" or "directly connected to" another element or layer, there are no intervening elements or layers present. As used herein, connected may refer to elements being physically and/or electrically connected to each other. It should be noted that in this application, like reference numerals denote like parts or elements. As used herein, the term "and/or" includes any and all combinations of one or more of the associated listed items.

It will be understood that, although the terms first, second, third, etc., may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the invention.

Spatially relative terms, such as "lower," "under," "above," "upper" and the like, may be used herein for ease of description to describe the relationship of one element or feature to another element(s) or feature(s) as illustrated in the figures. It will be understood that the spatially relative terms are intended to encompass different orientations of the device in use or operation, in addition to the orientation depicted in the figures. For example, if the device in the figures is turned over, elements described as "lower" or "under" relative to other elements or features would then be oriented "above" relative to the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of the invention. As used herein, the singular forms "a," "an" and "the" are intended to include the plural forms as well, unless the context clearly indicates otherwise. It will be further understood that the terms "comprises," "comprising," "includes" and/or "including," when used in this specification, specify the presence of stated features, integers, steps, operations, elements, and/or components, but do not preclude the presence or addition of one or more other features, integers, steps, operations, elements, components, and/or groups thereof.

Embodiments of the invention are described herein with reference to cross-section illustrations that are schematic illustrations of idealized embodiments (and intermediate structures) of the invention. As such, variations from the shapes of the illustrations as a result, for example, of manufacturing techniques and/or tolerances, are to be expected. Thus, embodiments of the invention should not be construed as limited to the particular shapes of regions illustrated herein but are to include deviations in shapes that result, for example, from manufacturing.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Hereinafter, the invention will be described in detail with reference to the accompanying drawings.

FIG. 1 illustrates an equivalent circuit diagram of an exemplary embodiment of one pixel in a liquid crystal display device according to the invention. Although FIG. 1 shows one pixel PX and an associated gate line GL, data line DL and reference voltage line RL for convenience purpose only, one or more exemplary embodiments may include a plurality of pixels PX arranged in the form of a matrix of rows and columns in a plan view, a plurality of gate lines GL each having a longitudinal axis extending in a (first) direction of a row and a plurality of data lines DL each having a longitudinal axis extending in a (second) direction of a column. The plurality of pixels PX may be disposed near respective intersections between the plurality of gate lines GL and the plurality of data lines DL, but the invention is not limited thereto or thereby.

Referring to FIG. 1, an exemplary embodiment of one pixel PX in a liquid crystal display device includes first, second and third switching elements Qa, Qb and Qc, and first and second liquid crystal capacitors C1 and C2, which may be formed of dielectric layers of liquid crystal layers. The first, second and third switching elements Qa, Qb and Qc may include thin film transistors ("TFTs").

The pixel PX is connected to a plurality of signal lines, including a gate line GL for transferring a gate signal, a data line DL for transferring a data signal, and a reference voltage line RL for transferring a reference voltage for voltage dividing.

The pixel PX includes first and second subpixels PEa and PEb. The first subpixel PEa includes the first switching element Qa and the first liquid crystal capacitor C1, and the second subpixel PEb includes the second and third switching elements Qb and Qc and the second liquid crystal capacitor C2.

Sources (e.g., input terminals) of the first and second switching elements Qa and Qb are connected to the data line DL, and gates (e.g., control terminals) thereof are connected to the gate line GL. A gate (e.g., control terminal) of the third switching element Qc is connected to the gate line GL.

A contact point CP between a drain (e.g., output terminal) of the second switching element Qb and a source of the third switching element Qc are each connected to a second subpixel electrode 191b of the second liquid crystal capacitor C2, and a drain (e.g., output terminal) of the first switching element Qa is connected to a first subpixel electrode 191a of the first liquid crystal capacitor C1. The first subpixel electrode 191a and the second subpixel electrode 191b may be a first terminal of the first liquid crystal capacitor C1 and the second liquid crystal capacitor C2, respectively. The other second terminals of the first liquid crystal capacitor C1 and the second liquid crystal capacitor C2 are each connected to a common electrode (not shown).

A drain of the third switching element Qc is connected to the reference voltage line RL.

The second subpixel electrode 191b is electrically connected to the reference voltage line RL via the third switching element Qc.

If a gate-on signal Von is applied to the gate line GL, the first, second and third switching elements Qa, Qb and Qc, whose gates are connected thereto, are turned on. Therefore, a data voltage DV applied to the data line DL is applied to the first subpixel electrode 191a via the turned-on first switching element Qa. If it is assumed that a reference voltage RV is applied to the reference voltage line RL, the voltage applied to the second subpixel electrode 191b is a voltage (DV-RV) having undergone voltage division by the third switching element Qc cascaded (or serially connected) to the second switching element Qb. Therefore, the voltage applied to the second subpixel electrode 191b is less than the voltage applied to the first subpixel electrode 191a.

As a result, a voltage charged in the first liquid crystal capacitor C1 is different from a voltage charged in the second liquid crystal capacitor C2. Therefore, liquid crystal molecules in the first and second subpixels PEa and PEb may be different in tilted angle, so the two subpixels PEa and PEb may have different luminance. If a voltage charged in the first liquid crystal capacitor C1 and a voltage charged in the second liquid crystal capacitor C2 are properly adjusted, images viewed from the side of the liquid crystal display device may substantially the same as images viewed from the front of the liquid crystal display device in terms of quality, improving the side visibility of the liquid crystal display device.

Figure 2:
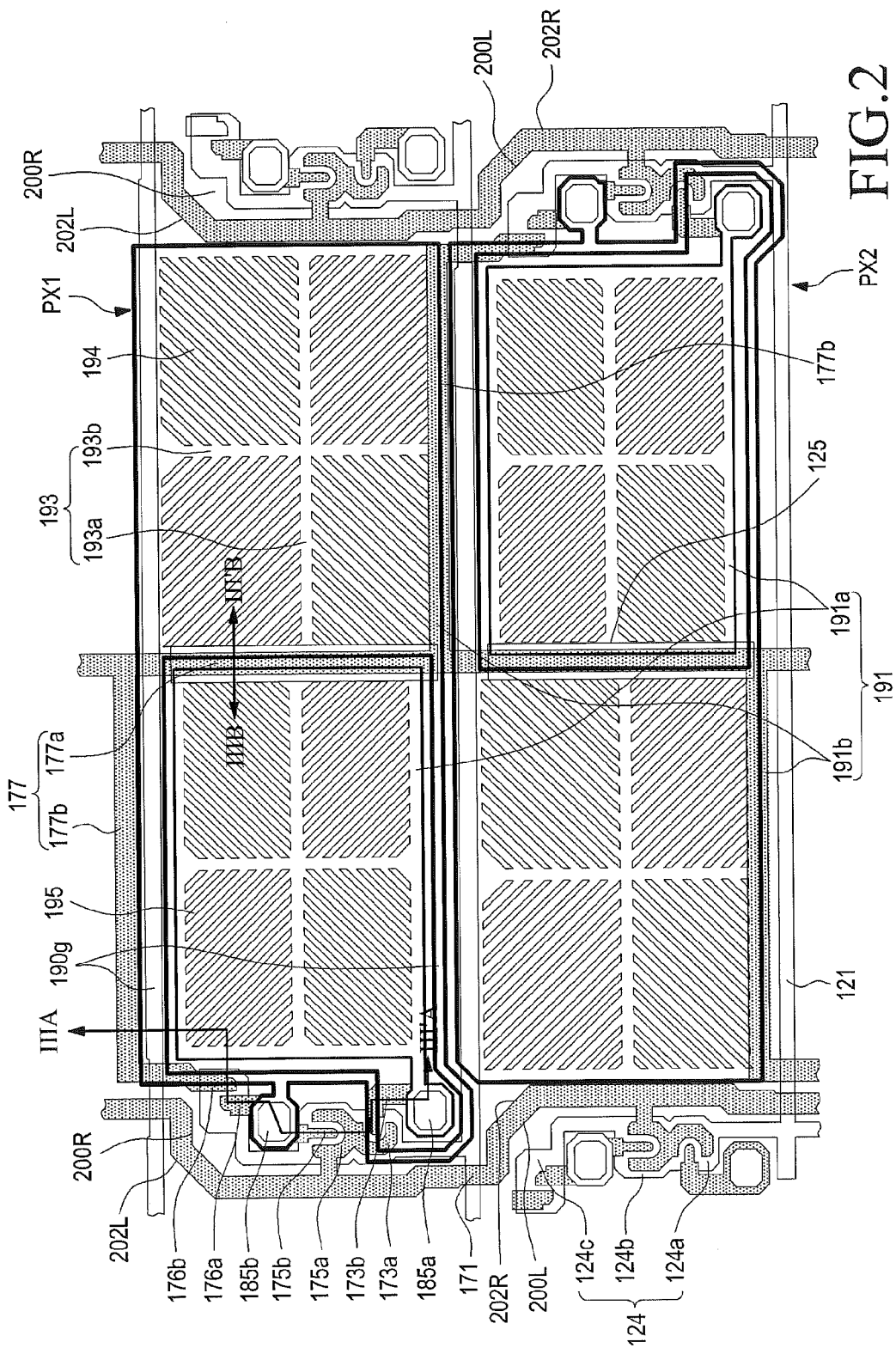
FIG. 2 is a plan view of an exemplary embodiment of upper and lower pixels in the liquid crystal display device shown in FIG. 1, according to the invention.
Figure 3A:
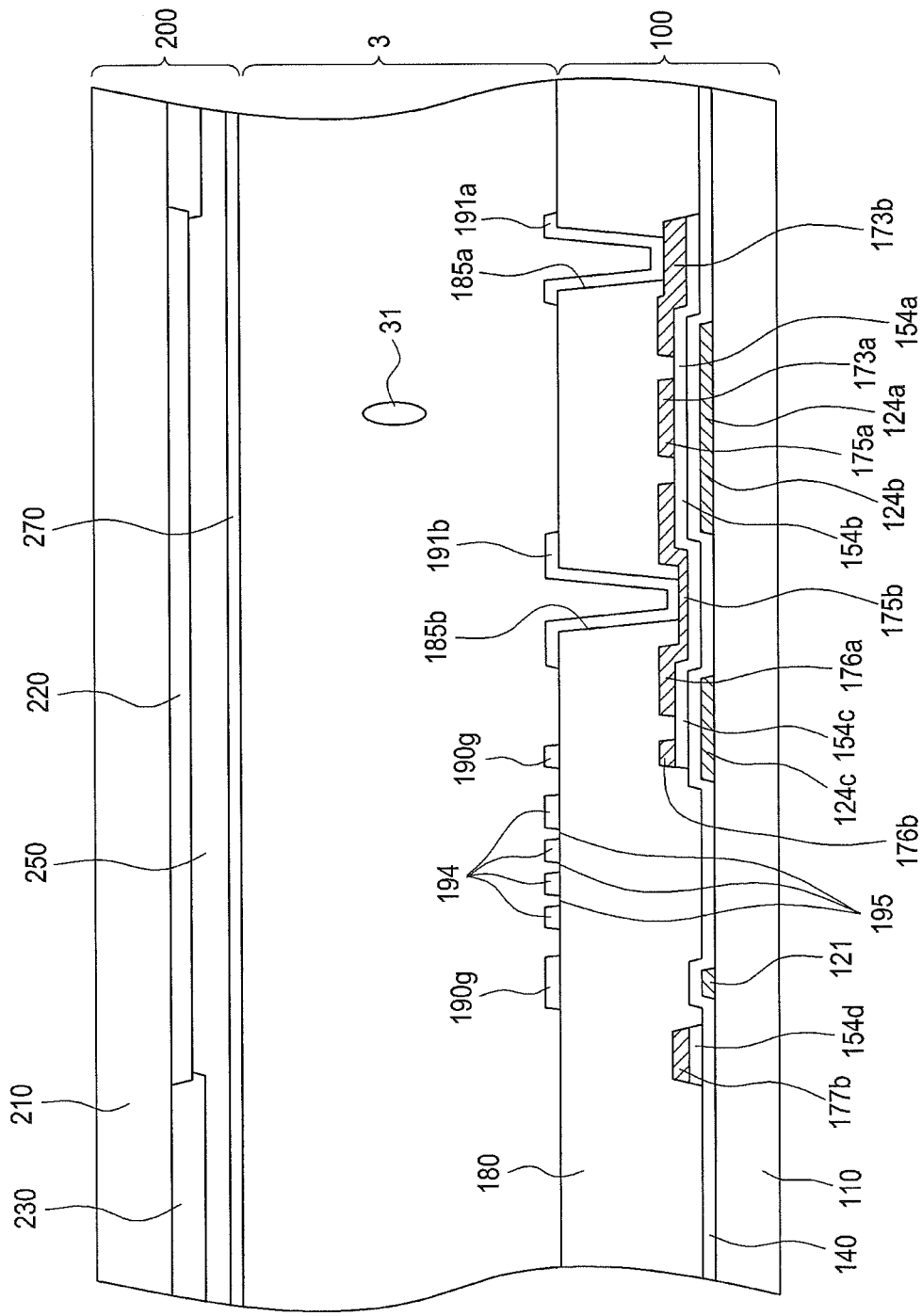
FIGS. 3A and 3B are cross-sectional views taken along lines IIIA-III'A and IIIB-III'B, respectively, in FIG. 2.

FIG. 2 is a plan view of an exemplary embodiment of adjacent upper and lower pixels in a liquid crystal display device according to the invention. Although, for convenience of description, FIG. 2 shows two adjacent data lines 171 each having a longitudinal axis extending in the direction of a column (e.g., vertical in FIG. 2), three adjacent gate lines 121 each having a longitudinal axis extending in the direction of a row (e.g., horizontal in FIG. 2), and two pixels PX1 and PX2 disposed between the data lines 171 and the gate lines 121, or disposed near intersections between the gate lines 121 and the data lines 171, it should be noted that a plurality of pixels PX may be arranged between a plurality of gate lines 121 and between a plurality of data lines 171 in the form of a matrix of rows and columns in the plan view. FIG. 3A is a cross-sectional view taken along line IIIA-IIIA' in FIG. 2, and FIG. 3B is a cross-sectional view taken along line IIIB-IIIB' in FIG. 2.

Figure 3B:
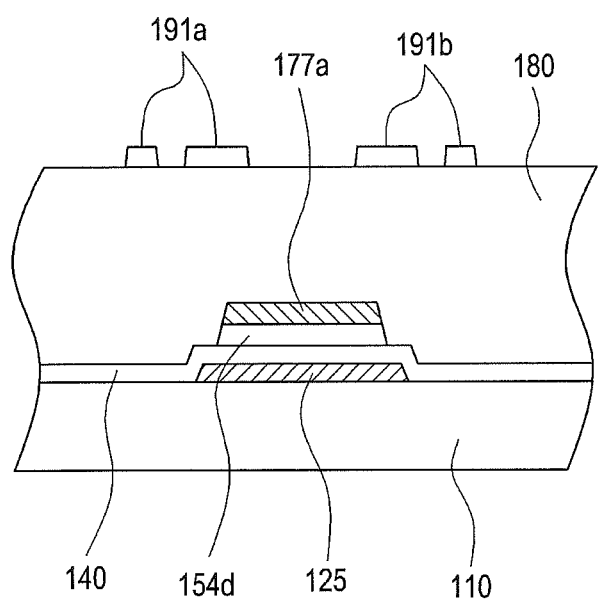

Referring to FIGS. 2, 3A and 3B, an exemplary embodiment of a liquid crystal display device includes a lower display panel 100, an upper display panel 200 facing the lower display panel 100, a liquid crystal layer 3 interposed between the two display panels 100 and 200. A pair of polarizers (not shown) may be attached to outer sides of the display panels 100 and 200.

Gate lines 121, data lines 171, and the lower display panel 100 for connecting pixel electrodes to their associated gate lines 121 and data lines 171 will be described. A plurality of gate lines 121 each having a longitudinal axis extending in the direction of a row and a plurality of data lines 171 each having a longitudinal axis extending in the direction of a column are situated on a first substrate 110. The first substrate 110 may include transparent glass or plastic. Pixel electrodes 191 are situated between adjacent gate lines 121 and between adjacent data lines 171. Each pixel electrode 191 includes a first subpixel electrode (or first-area electrode) 191a and a second subpixel electrode (or second-area electrode) 191b.

Each of the first and second subpixel electrodes 191a and 191b has quadrants divided by a cross-shaped branch portion 193 having a horizontal branch portion 193a and a vertical branch portion 193b. Each quadrant includes micro branches 194 which are tilted with respect to the cross-shaped branch portion 193 at a predetermined angle (e.g., at an angle of 45°). Micro slits 195 are respectively between adjacent micro branches 194.

A reference voltage line 177 is situated in a boundary area between adjacent first and second subpixel electrodes 191a and 191b, and between adjacent data lines 171. The reference voltage line 177 includes a vertical portion 177a passing through the pixels PX1 and PX2, and horizontal portions 177b electrically connecting the vertical portion 177a to the second subpixel electrodes 191b. The switching elements Qa, Qb and Qc in FIG. 1 are electrically connected to the gate lines 121 and the data lines 171.

Each gate line 121 has a collective gate electrode 124 including first, second and third gate electrodes 124a, 124b and 124c. Although not shown, the gate line 121 includes at an end thereof, a contact portion having a relatively wide planar area for connection with another layer and/or an external drive circuit. The collective gate electrode 124 vertically protrudes from the gate line 121 in the plan view, as illustrated in FIG. 2.

A light blocking film 125 is situated in a boundary area between the adjacent first and second subpixel electrodes 191a and 191b which are between adjacent gate lines 121. The light blocking film 125 may include a same material and be on and/or in a same layer as the gate lines 121.

A gate insulating film 140 covers (e.g., overlaps) the gate lines 121. Semiconductor layers 154a, 154b, 154c and 154d are situated on the gate insulting film 140. The data lines 171, first drain electrodes 173b, second drain electrodes 175b, third source electrodes 176a, third drain electrodes 176b, and the reference voltage lines 177 are on the semiconductor layers 154a, 154b, 154c and 154d. Each data line 171 includes first and second source electrodes 173a and 175a. The data lines 171, the first drain electrodes 173b, the second drain electrodes 175b, the third source electrodes 176a, the third drain electrodes 176b and the reference voltage lines 177 will be referred to herein as data conductors 171, 173b, 175b, 176a, 176b and 177.

Each data line 171 crosses the gate lines 121. Each data line 171 includes concave portions 200R and 200L, and convex portions 202R and 202L which alternate on both sides (e.g., right and left sides) along the longitudinal axis of the each data line 171. While concave portions 200R in one row among two adjacent pixel rows are disposed toward the right, concave portions 200L in the other pixel row among the two adjacent pixel rows are disposed toward the left. Therefore, concave portions 200R or 200L of one of the data lines 171 alternately have convex portions 202L or 202R of the one data line 171 respectively adjacent thereto.

Again, while concave portions 200R of the data line 171 in one pixel row among two adjacent pixel rows are disposed toward the right, concave portions 200L in the other pixel row among the two adjacent pixel rows are disposed toward the left. Therefore, in a same row, one concave portion 200R or 200L of one of the data lines 171 respectively faces one convex portion 202L or 202R of an adjacent data line 171 along the row direction. Along the column direction of the pixel rows, the concave portions 200R and 200L are alternately disposed, for example, to the left and to the right, between two adjacent data lines 171.

In each concave portion 200R or 200L, first and second source electrodes 173a and 175a protrude from each data line 171, and are situated on and overlapping first and second gate electrodes 124a and 124b, respectively. The first drain electrode 173b is situated to be spaced apart from the first source electrode 173a and faces the first source electrode 173a. The second drain electrode 175b is situated to be spaced apart from the second source electrode 175a and faces the second source electrode 175a. The third source electrode 176a connected to the second drain electrode 175b is situated on and overlapping the third gate electrode 124c. The third drain electrode 176b is situated to be spaced apart from the third source electrode 176a and faces the third source electrode 176a.

Each data line 171 includes at an end thereof, a contact portion (not shown) having a relatively wide planar area for connection with another layer and/or an external drive circuit.

The first gate electrode 124a, the first source electrode 173a and the first drain electrode 173b form a first TFT corresponding to the first switching element Qa in FIG. 1, together with the first semiconductor layer 154a. Similarly, the second gate electrode 124b, the second source electrode 175a and the second drain electrode 175b form a second TFT corresponding to the second switching element Qb in FIG. 1, together with the second semiconductor layer 154b. The third gate electrode 124c, the third source electrode 176a and the third drain electrode 176b form a third TFT corresponding to the third switching element Qc in FIG. 1, together with the third semiconductor layer 154c. Therefore, the switching elements Qa, Qb and Qc such as TFTs shown in FIG. 1 are all within each concave portion 200R or 200L of the data line 171, as shown in FIG. 2.

The third, second and first TFTs Qc, Qb and Qa are sequentially disposed in turn along the data line 171 starting from a top each concave portion 200R or 200L. The first, second and third TFTs Qa, Qb and Qc form a portion of associated switching elements. The concave portions 200R and 200L of the data line 171 and the associated switching elements are situated adjacent to the first subpixel electrodes 191a. The concave portions 200R and 200L of the data line 171 and the associated switching elements are disposed to alternate in upper pixel PX1 and lower pixel PX2, along the column direction of the pixel rows.

The reference voltage lines 177 may be in areas excluding the micro slits 195 and micro branches 194, between the first and second subpixel electrodes 191a and 191b adjacent in the row direction, and between upper and lower pixels PX1 and PX2 adjacent in the column direction. The reference voltage lines 177 may include a same material and be on and/or in a same layer as the data lines 171.

The vertical portion 177a of each reference voltage line 177 passes through vertically adjacent pixels PX1 and PX2 in the direction of a column, and vertically extends along the boundary between the first and second subpixel electrodes 191a and 191b which are horizontally adjacent in the direction of a row. The vertical portion 177a is situated to overlap the light blocking film 125. Horizontal portions 177b of each reference voltage line 177 extend along and/or parallel to a horizontal side of the pixel electrode 191.

The horizontal portions 177b are situated to alternate with each other along a direction of the vertically adjacent pixels PX1 and PX2, because they extend from the vertical portion 177a and are connected to the third drain electrodes 176b situated in the concave portions 200R and 200L. In one exemplary embodiment, for example, referring to FIG. 2, the horizontal portion 177b connected to the third drain electrode 176b of the upper pixel PX1 extends from the vertical portion 177a in a first direction (e.g., left direction). The horizontal portion 177b connected to the third drain electrode 176b of the lower pixel PX2 extends from the vertical portion 177a in a second direction (e.g., right direction). The horizontal portion 177b electrically connected to the lower pixel PX2 may be situated between the pixel electrode 191 of the upper pixel PX1 and the gate line 121 electrically connected to the upper pixel PX1, making it possible to reduce signal interference between the pixel electrodes 191 and the gate lines 121. The horizontal portion 177b electrically connected to the lower pixel PX2 may partially overlap the pixel electrode 191 of the upper pixel PX1.

Although not illustrated, an ohmic contact member may be situated between data conductors 171, 173b, 175b, 176a, 176b and 177 and semiconductor layers 154a, 154b, 154c and 154d situated thereunder. In an exemplary embodiment of a method of forming the liquid crystal display device, the data conductors, the semiconductor layer and the ohmic contact member may be simultaneously formed using a single mask. In this case, referring to FIG. 3B, a fourth semiconductor layer 154d may be situated under the vertical portion 177a of the reference voltage line 177 that passes through the pixels PX1 and PX2. In the absence of the light blocking film 125, the fourth semiconductor layer 154d may be exposed to light. A current may flow in the fourth semiconductor layer 154d being exposed to light, affecting a voltage charge rate of pixels and leading to poor image quality of the liquid crystal display device. To prevent the poor image quality, the light blocking film 125 overlaps the vertical portion 177a of the reference voltage line 177, reducing or effectively preventing exposure of the semiconductor layer to light.

An insulating layer or a passivation layer 180 is on the data conductors 171, 173b, 175b, 176a, 176b and 177 and the exposed semiconductor layers 154a, 154b, 154c and 154d. The passivation layer 180 may have a flat surface. The passivation layer 180 may include a plurality of contact holes 185a and 185b extended through a thickness of the passivation layer 180, such that the contact holes 185a and 185b expose the first and second drain electrodes 173b and 175b.

The pixel electrodes 191 including the first and second subpixel electrodes 191a and 191b are on the passivation layer 180. The pixel electrodes 191 may include a transparent conductive material such as indium tin oxide ("ITO") and indium zinc oxide ("IZO"), or a reflective metal such as aluminum, silver, chrome and an alloy thereof.

Each pixel electrode 191 includes a first side parallel to the gate line 121 and a second side parallel to the data line 171. The first side parallel to the gate line 121 is about three times longer than the second side parallel to the data line 171. As the first side of the pixel electrode 191 is longer in length than the second side thereof, the pixel PX may be referring to as having a structure in which a horizontal side of the pixel electrode 191 is longer than a vertical side of the pixel electrode 191. Therefore, compared to the case where a length of the horizontal side is less than a length of the vertical side, since the exemplary embodiment has the horizontal side longer than the vertical side, the number of pixel electrodes 191 situated on each vertical line (e.g., in a direction of the column) is greater, and the number of pixel electrodes 191 situated on each horizontal line (e.g., in a direction of the row) is less. Thus, the total number of the data lines 171 is reduced, making it possible to reduce the number of integrated circuit ("IC") chips for data drivers, contributing to a reduction in material costs. Despite the increase in the number of gate lines 121 when the total number of data lines is reduced, since gate drivers may be integrated in a liquid crystal display panel assembly along with gate lines 121, data lines 171 and TFTs, the increase in the number of gate lines 121 does not present a significant increase in material costs and/or manufacturing time. Even though gate drivers are mounted in the form of an IC chip, since the price of the IC chips for gate drivers is relatively cheaper than the IC chips for data drivers, it is more advantageous to reduce the number of IC chips for data drivers.

The first and second subpixel electrodes 191a and 191b are physically and electrically connected to the first and second drain electrodes 173b and 175b through the contact holes 185a and 185b, respectively. Referring to the first and second subpixel electrodes 191a and 191b in a pixel row between two adjacent data lines 171, the first subpixel electrode 191a is adjacent to the first drain electrode 173b in the plan view. On the other hand, the second subpixel electrode 191b is spaced apart from the second drain electrode 175b by at least one-side length or more of the first subpixel electrode 191a. The second subpixel electrode 191b includes a connection portion 190g extended directly therefrom, such that the subpixel electrode and the connection portion 190g collectively form a single, unitary, indivisible member. Therefore, the second subpixel electrode 191b is physically and electrically connected directly to the second drain electrode 175b by the connection portion 190g.

The connection portion 190g includes a first portion parallel to the gate line 121 and the horizontal portion 177b of the reference voltage line 177, and a second portion parallel to the data line 171. The first subpixel electrode 191a is surrounded by the connection portion 190g and one side of the second subpixel electrode 191b, in the plan view. That is, the first subpixel electrode 191a is completely enclosed by the second subpixel electrode 191b.

In adjacent upper and lower pixels PX1 and PX2, first and second subpixel electrodes 191a and 191b are alternately disposed in the direction of the row and in the direction of the column Referring to FIG. 2, the first subpixel electrode 191a of the upper pixel PX1 is situated on the left side of the second subpixel electrode 191b of the upper pixel PX1. In contrast, the first subpixel electrode 191a of the lower pixel PX2 is situated on the right side of the second subpixel electrode 191b of the lower pixel PX2. Therefore, the second subpixel electrode 191b of the lower pixel PX2 is disposed under the first subpixel electrode 191a of the upper pixel PX1 in the direction of the column in the plan view.

The first and second subpixel electrodes 191a and 191b receive data voltages from the first and second drain electrodes 173b and 175b, respectively. As some of the data voltage applied to the second drain electrode 175b undergoes voltage division by the third source electrode 176a, a level of the voltage applied to the second subpixel electrode 191b is less than a level of the voltage applied to the first subpixel electrode 191a. The upper display panel 200 will now be described with reference to FIGS. 2 and 3A.

A light blocking member 220 is on a second substrate 210. The second substrate 210 may include transparent glass or plastic. The light blocking member 220, also known as a black matrix, reduces or effectively prevents light leakage.

A plurality of color filters 230 are on the second substrate 210 and the light blocking member 220. The color filter 230 mostly exists in an area defined and surrounded by the light blocking member 220, and may have a longitudinal axis horizontally extended along the pixel electrode 191. Each color filter 230 may display one of the three primary colors such as red, green and blue. However, the color filter 230 may display one of cyan, magenta, yellow and white-series color without being limited to the primary colors of red, green and blue.

In an alternative exemplary embodiment, one of the light blocking member 220 and the color filter 230 may be on the first substrate 110 and within the lower display panel 100.

An overcoat 250 is on the color filter 230 and the light blocking member 220. The overcoat 250, reduces or effectively prevents the color filter 230 from being exposed and provides a flat surface. The overcoat 250 may include an insulating material. In an alternative exemplary embodiment, the overcoat 250 may be omitted.

A common electrode 270 is on the overcoat 250.

Although not illustrated, alignment layers may be on inner surfaces of the display panels 100 and 200, and these alignment layers may be vertical alignment layers.

Polarizers (not shown) are provided on outer surfaces of the display panels 100 and 200. Preferably, polarization axes of the two polarizers may be orthogonal to each other, and one of the polarization axes may be parallel to the gate line 121. For a reflective liquid crystal display device, one of the two polarizers may be omitted.

A liquid crystal layer 3 is between the two display panels 100 and 200, and the liquid crystal layer 3 includes liquid crystal molecules 31 having negative dielectric anisotropic properties. The liquid crystal molecules 31 in the liquid crystal layer 3 may be aligned such that the major axis of the liquid crystal molecules 31 may be perpendicular to the surfaces of the two display panels 100 and 200 when no electric field is applied to liquid crystal layer 3.

The first and second subpixel electrodes 191a and 191b, to which data voltages are applied, generate an electric field together with the common electrode 270 within the upper display panel 200, to which a common voltage is applied, thereby determining a direction of the liquid crystal molecules 31 in the liquid crystal layer 3 between the common electrode 270, and the first and second subpixel electrodes 191a and 191b. The polarization of light passing through the liquid crystal layer 3 may vary depending on the determined direction of the liquid crystal molecules 31. As the first and second subpixel electrodes 191a and 191b and the common electrode 270 form terminals of the liquid crystal capacitors C1 and C2 in FIG. 1, they may maintain the applied voltages even after the TFTs are turned off.

Sides or edges of the micro branches 194 of the subpixel electrodes 191a and 191b make horizontal direction components perpendicular to the sides of the micro branches 194 by distorting the electric field, and a tilted direction of the liquid crystal molecules 31 is determined based on the horizontal direction components. Therefore, the liquid crystal molecules 31 first tend to be tilted in a direction perpendicular to the sides of the micro branches 194. However, because the horizontal direction components of the electric field by the sides of adjacent micro branches 194 have opposite directions and a gap between the micro branches 194 is narrow, liquid crystal molecules 31 tending to be tilted in the opposite directions may be tilted together in a direction parallel to a longitudinal axis direction of the micro branches 194.

In accordance with an exemplary embodiment of the invention, because micro branches 194 of one pixel extend in four different longitudinal directions, the liquid crystal molecules 31 may also have four different tilted directions, thereby increasing the viewing angle of the liquid crystal display device.

However, liquid crystal molecules 31 located in specific areas, e.g., side areas of the connection portion 190g and corner areas of the pixel electrode 191 may not be tilted in a direction parallel to the longitudinal axis of the micro branches 194. The liquid crystal molecules 31 in these areas may not contribute to improvement of luminance because of the low transmittance of light, compared to those in the areas where the liquid crystal molecules 31 are tilted in a predetermined direction (e.g., a direction parallel to the longitudinal axis of the micro branches 194). These areas are called non-transmission areas.

In accordance with one or more exemplary embodiments of the invention, the reference voltage line 177 may maximize transmittance of pixels PX as the reference voltage line 177 is in non-transmission areas. Referring to FIG. 2, for example, the vertical portion 177a of the reference voltage line 177 may overlap a boundary area between the first and second subpixel electrodes 191a and 191b adjacent in the direction of the row, and may overlap sides or edges of the adjacent subpixel electrodes 191a and 191b. A horizontal portion 177b electrically connected to the upper pixel PX1 may be situated between the pixel electrode 191 of the upper pixel PX1 and the gate line 121 connected to the upper pixel PX1. A horizontal portion 177b electrically connected to the lower pixel PX2 may partially overlap one side of the second subpixel electrode 191b of the upper pixel PX1. The vertical portion 177a of the reference voltage line 177 is situated to pass through pixels PX adjacent in the direction of the column without being adjacent to the data line 171, thereby reducing possible electrical short defects with the data line 171.

Figure 4:
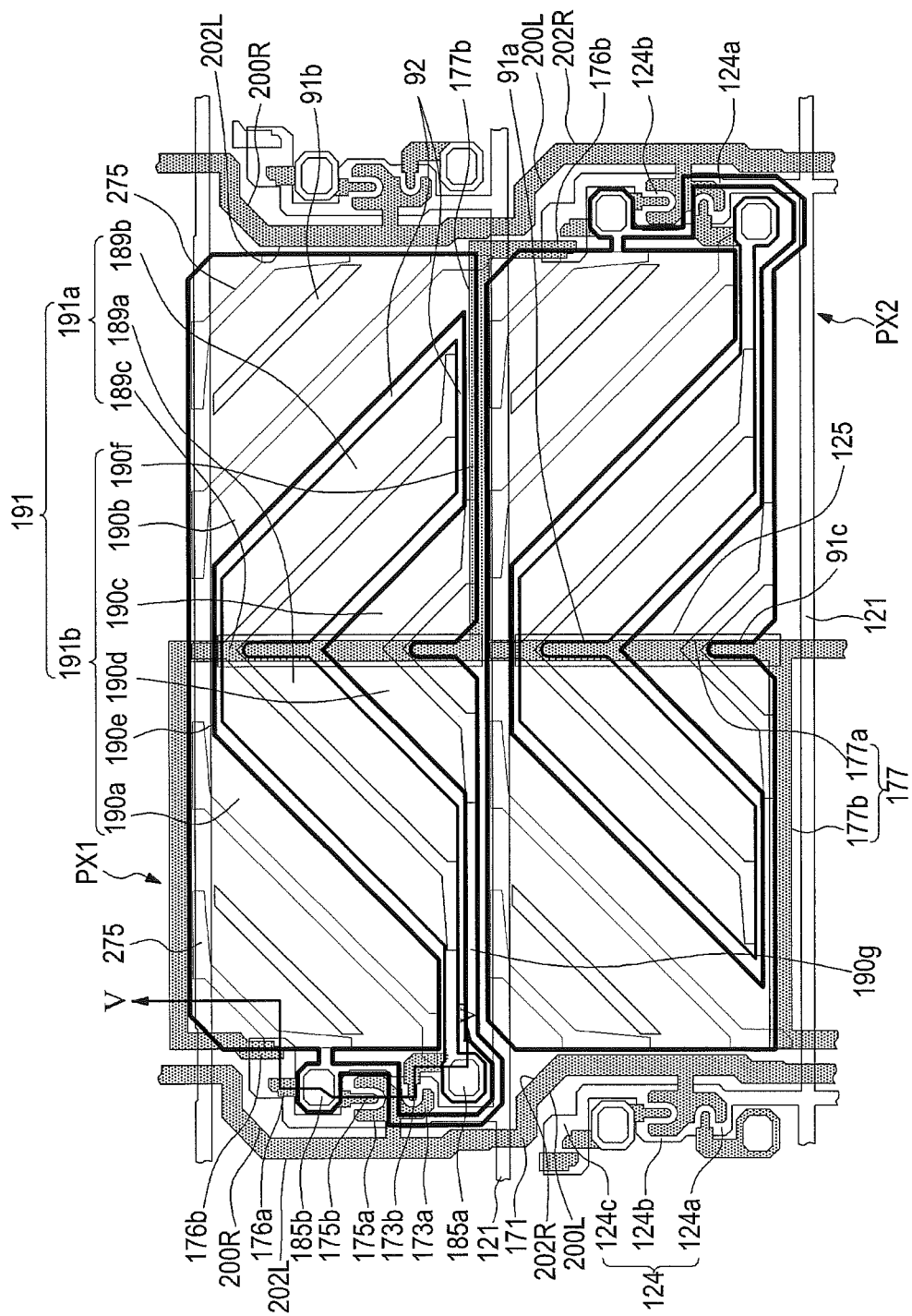
FIG. 4 is a plan view of another exemplary embodiment of upper and lower pixels in the liquid crystal display device shown in FIG. 1, according to the invention.
Figure 5:
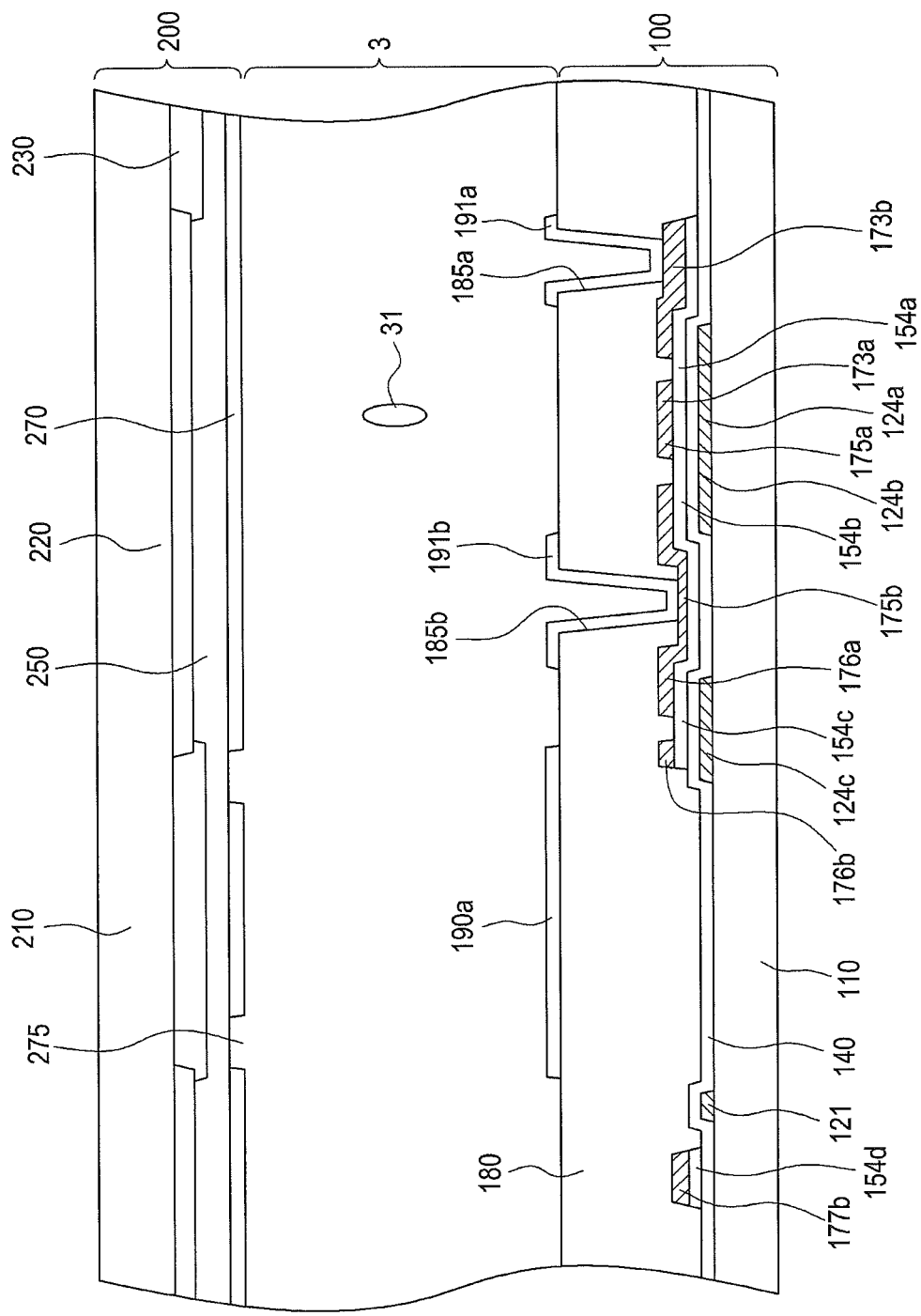
FIG. 5 is a cross-sectional view taken along line V-V' in FIG. 4.

FIG. 4 is a plan view of another exemplary embodiment of adjacent upper and lower pixels in a liquid crystal display device according to the invention. Although, for convenience of description, FIG. 4 shows two adjacent data lines 171 each having a longitudinal axis extending in the direction of a column (e.g., vertical in FIG. 4), three adjacent gate lines 121 each having a longitudinal axis extending in the direction of a row (e.g., horizontal in FIG. 4), and two pixels PX1 and PX2 disposed between the data lines 171 and the gate lines 121, or disposed near intersections between the gate lines 121 and the data lines 171, it should be noted that a plurality of pixels PX may be arranged between a plurality of gate lines 121 and between a plurality of data lines 171 in the form of a matrix of rows and columns in the plan view. FIG. 5 is a cross-sectional view taken along line V-V' in FIG. 4. Referring to FIGS. 4 and 5, the exemplary embodiment of a liquid crystal display device is similar in structure to the liquid crystal display device shown in FIGS. 2, 3A and 3B, and like reference numerals denote like elements. So, the same elements will not be described to avoid repetitive description thereof.

The exemplary embodiment of the liquid crystal display device in FIGS. 4 and 5 is different in shape from the liquid crystal display device shown in FIGS. 2, 3A and 3B in that the pixel electrodes 191 and the common electrode 270 include incision portions. An incision portion is an opening or slit which may extend through a thickness of a respective electrode, where the opening or slit excludes material of the respective electrode.

A plurality of gate lines 121 and a plurality of data lines 171 are situated on a first substrate 110. The gate lines 121 each have a longitudinal axis which extends in the direction of a row, while the data lines 171 each have a longitudinal axis which extends in the direction of a column. Pixel electrodes 191 are situated between adjacent gate lines 121 and between adjacent data lines 171. Each pixel electrode 191 includes first and second subpixel electrodes 191a and 191b having a 'V' shape or a 'V' shape with its vertex clipped. Reference voltage lines 177 are situated between adjacent data lines 171. Each reference voltage line 177 includes a vertical portion 177a passing through upper and lower pixels PX1 and PX2 adjacent in the direction of the column, so as to overlap the vertex of the 'V' shape of the pixel electrodes 191, and horizontal portions 177b extending from the vertical portion 177a and electrically connecting the vertical portion 177a to the second subpixel electrodes 191b.

Each first subpixel electrode 191a includes first and second areas 189a and 189b each having a longitudinal axis extending along a direction oblique to the gate line 121, and a first connecting bridge 189c connecting the first and second areas 189a and 189b to each other. A first incision portion 91a dividing the first and second areas 189a and 189b extends in a direction perpendicular to the first connecting bridge 189c.

Similarly, each second subpixel electrode 191b includes third, fourth, fifth and sixth areas 190a, 190b, 190c and 190d each having a longitudinal axis extending along a direction oblique to the gate line 121, and second and third connecting bridges 190e and 190f. The third and fourth areas 190a and 190b are connected to each other by the second connecting bridge 190e, and each of the third and fourth areas 190a and 190b includes a second incision portion 91b. The fifth area 190c is connected to the fourth area 190b by the third connecting bridge 190f. The fifth and sixth areas 190c and 190d are divided by a third incision portion 91c.

The first subpixel electrode 191a is surrounded by the second subpixel electrode 191b. That is, the first subpixel electrode 191a is completely enclosed by the second subpixel electrode 191b, in the plan view of the pixel PX. The first and second subpixel electrodes 191a and 191b are separated within the pixel PX by a spacing portion 92 defined between two adjacent edges of the first and second subpixel electrodes 191a and 191b.

The first and second subpixel electrodes 191a and 191b are physically and electrically connected to the first and second drain electrodes 173b and 175b via contact holes 185a and 185b, respectively.

Referring to the first and second subpixel electrodes 191a and 191b in a pixel row between two adjacent data lines 171, the third area 190a of the second subpixel electrode 191b is adjacent to the second drain electrode 175b in the plan view. On the other hand, the sixth area 190d of the second subpixel electrode 191b is not adjacent to the second drain electrode 175b. In other words, the first subpixel electrode 191a is between the sixth area 190d of the second subpixel electrode 191b and the second drain electrode 175b. The second subpixel electrode 191b includes a connection portion 190g extended directly therefrom, such that the subpixel electrode and the connection portion 190g collectively form a single, unitary, indivisible member. Therefore, the sixth area 190d of the second subpixel electrode 191b is physically and electrically connected directly to the second drain electrode 175b by the connection portion 190g that extends in a first direction (e.g., left direction) opposite to a second direction (e.g., right direction) in which extends the third connecting bridge 190f, respect to the third incision portion 91c. The connection portion 190g includes a first portion parallel to the gate line 121 and a second portion parallel to the data line 171, and is disposed to surround part of the first contact hole 185a.

The first and second subpixel electrodes 191a and 191b receive data voltages from the first and second drain electrodes 173b and 175b, respectively. As some of the data voltage applied to the second drain electrode 175b undergoes voltage division by a third source electrode 176a, a level of the voltage applied to the second subpixel electrode 191b is less than a level of the voltage applied to the third subpixel electrode 191a.

Referring to FIG. 5, a common electrode 270 on an upper display panel 200 includes fourth incision portions 275. The fourth incision portions 275 are arranged to alternate with the second incision portions 91b of the pixel electrode 191, in the plan view. The fourth incision portions 275 are situated between the second incision portions 91b and the spacing portion 92, respectively, and include a first portion parallel to the second incision portion 91b and a second portion parallel to one side of the pixel electrode 191.

The first and second subpixel electrodes 191a and 191b, to which data voltages are applied, generate an electric field together with the common electrode 270 within the upper display panel 200, to which a common voltage is applied, thereby determining a direction of liquid crystal molecules 31 in a liquid crystal layer 3 between the common electrode 270, and the first and second subpixel electrodes 191a and 191b.

A fringe field is formed between the pixel electrode 191 and the common electrode 270 by the incision portions 91a, 91b, 91c and 275, and the liquid crystal molecules 3 are tilted in a direction perpendicular to the fringe field. In other words, liquid crystal molecules 31 located in the first, third and sixth areas 189a, 190a, and 190d are tilted in a counterclockwise direction with respect to the gate line 121, such as at an angle of about 135 degrees (°). Liquid crystal molecules 31 located in the second, fourth and fifth areas 189b, 190b and 190c are tilted in a counterclockwise direction with respect to the gate line 121, such as at an angle of about 45°. However, liquid crystal molecules 31 located in specific areas (e.g., areas of the connecting bridges 189c, 190e and 190f, sides of the pixel electrode 191, and areas of the first and third incision portions 91a and 91c) are not tilted in the predetermined direction, for example, at an angle of about 45° or about 135° described above. The liquid crystal molecules 31 in these areas, compared to those in the areas where they are tilted in the predetermined direction, may not contribute to improvement of luminance because of the low transmittance of light. These areas are called non-transmission areas.

In accordance with one or more exemplary embodiments of the invention, the reference voltage line 177 may maximize the transmittance of pixels PX as the reference voltage line 177 is in the non-transmission areas. Referring to FIG. 4, for example, vertical portion 177a of the reference voltage line 177 may overlap the first and second connecting bridges 189c and 190e. The vertical portion 177a may be situated to overlap the first incision portion 91a dividing the first and second areas 189a and 189b of the first subpixel electrode, and the third incision portion 91c dividing the fifth and sixth areas 190c and 190d of the second subpixel electrode 191b. A horizontal portion 177b electrically connected to the lower pixel PX2 may be situated between the pixel electrode 191 of the upper pixel PX1 and the gate line 121 connected to the upper pixel PX1. The horizontal portion 177b electrically connected to the lower pixel PX2 may partially overlap the third connecting bridge 190f of the second subpixel electrode 191b. The horizontal portion 177b may be situated to be parallel to the gate line 121 and to face at least part of the connection portion 190g.

The characteristics of the liquid crystal display device shown in FIGS. 2, 3A and 3B may be applied to the liquid crystal display device shown in FIGS. 4 and 5.

Figure 6:
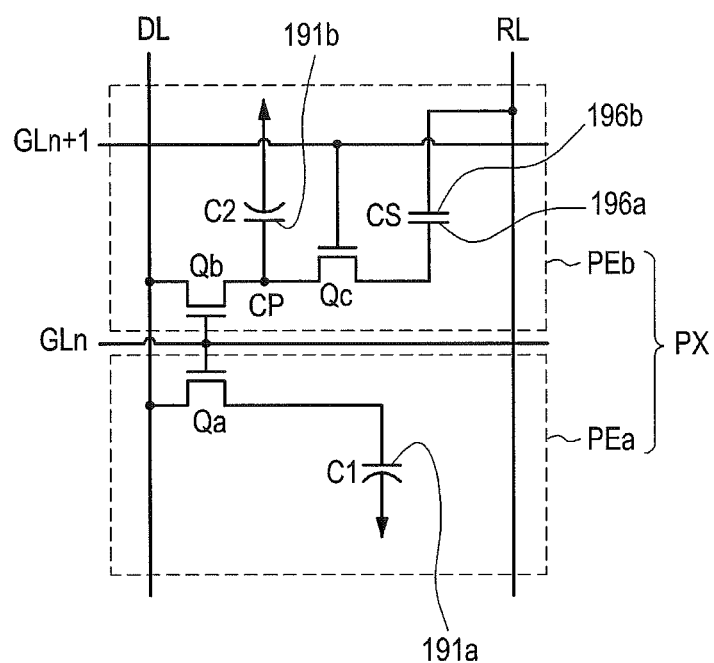
FIG. 6 illustrates an equivalent circuit diagram of another exemplary embodiment of one pixel in a liquid crystal display device according to the invention.

FIG. 6 illustrates an equivalent circuit diagram of another exemplary embodiment of one pixel in a liquid crystal display device according to the invention. Although, for convenience of description, FIG. 6 shows one pixel PX and an associated gate line GL, data line DL and reference voltage line RL, one or more exemplary embodiments may include a plurality of pixels PX arranged in the form of a matrix of rows and columns in a plan view, a plurality of gate lines GL each having a longitudinal axis extending in a (first) direction of a row and a plurality of data lines DL each having a longitudinal axis extending in a (second) direction of a column. The plurality of pixels PX may be disposed near respective intersections between the plurality of gate lines GL and the plurality of data lines, but the invention is not limited thereto or thereby.

Referring to FIG. 6, an exemplary embodiment of one pixel PX in a liquid crystal display device includes first, second and third switching elements Qa, Qb and Qc (such as TFTs), a charge sharing capacitor CS, and first and second liquid crystal capacitors C1 and C2.

The pixel PX is connected to a plurality of signal lines, including a gate line GL for transferring a gate signal, a data line DL for transferring a data signal, and a reference voltage line RL for transferring a reference voltage for voltage dividing.

The pixel PX includes first and second subpixels PEa and PEb. The first subpixel PEa includes the first switching element Qa and the first liquid crystal capacitor C1. The second subpixel PEb includes the second and third switching elements Qb and Qc, the charge sharing capacitor CS, and the second liquid crystal capacitor C2.

Sources (e.g., input terminals) of the first and second switching elements Qa and Qb are connected to the data line DL, and gates (e.g., control terminals) thereof are connected to a stage gate line GLn. A gate (e.g., control terminal) of the third switching element Qc is connected to a post-stage gate line GLn+1. A stage gate line GLn connected to the pixel PX receives an N-th gate signal, and the post-stage gate line GLn+1 receives an (N+1)-th gate signal following the N-th gate signal.

A contact point CP between a drain (e.g., output terminal) of the second switching element Qb and a source of the third switching element Qc is connected to the second subpixel electrode 191b of the second liquid crystal capacitor C2, and a drain (e.g., output terminal) of the first switching element Qa is connected to the first subpixel electrode 191a of the first liquid crystal capacitor C1. The first subpixel electrode 191a and the second subpixel electrode 191b may be a first terminal of the first liquid crystal capacitor C1 and the second liquid crystal capacitor C2, respectively. The other second terminals of the first liquid crystal capacitor C1 and the second liquid crystal capacitor C2 are each connected to a common electrode.

A drain (e.g., output terminal) of the third switching element Qc is connected to a first electrode 196a of the charge sharing capacitor CS.

A second electrode 196b of the charge sharing capacitor CS is connected to the reference voltage line RL. The reference voltage line RL is electrically connected to the second subpixel electrode 191b with the charge sharing capacitor CS and the third switching element Qc interposed therebetween.

If a gate-on signal Von is applied to the stage gate line GLn, the first and second switching elements Qa and Qb, whose gates are connected thereto, are turned on. Therefore, a data voltage DV applied to the data line DL is applied to the first and second subpixel electrodes 191a and 191b via the turned-on first and second switching elements Qa and Qb, respectively, charging the first and second liquid crystal capacitors C1 and C2. If a gate-off signal Voff is applied to the stage gate line GLn and a gate-on signal Von is applied to the post-stage gate line GLn+1, the third switching element Qc is turned on and the second liquid crystal capacitor C2 is electrically connected to the charge sharing capacitor CS. Due to the connection between the second liquid crystal capacitor C2 and the charge sharing capacitor CS, charge sharing occurs between the second liquid crystal capacitor C2 and the charge sharing capacitor CS.

Therefore, the voltage charged in the first liquid crystal capacitor C1 may be different from the voltage charged in the second liquid crystal capacitor C2. Because of the difference between the voltage charged in the first liquid crystal capacitor C1 and the voltage charged in the second liquid crystal capacitor C2, liquid crystal molecules in the first and second subpixels PEa and PEb may have different tilted angles, so the two subpixels PEa and PEb may have different luminance. If a voltage charged in the first liquid crystal capacitor C1 and a voltage charged in the second liquid crystal capacitor C2 are properly adjusted, images viewed from the side of the liquid crystal display device may be substantially the same as images viewed from the front of the liquid crystal display device in terms of quality, improving the side visibility of the liquid crystal display device.

Figure 7:
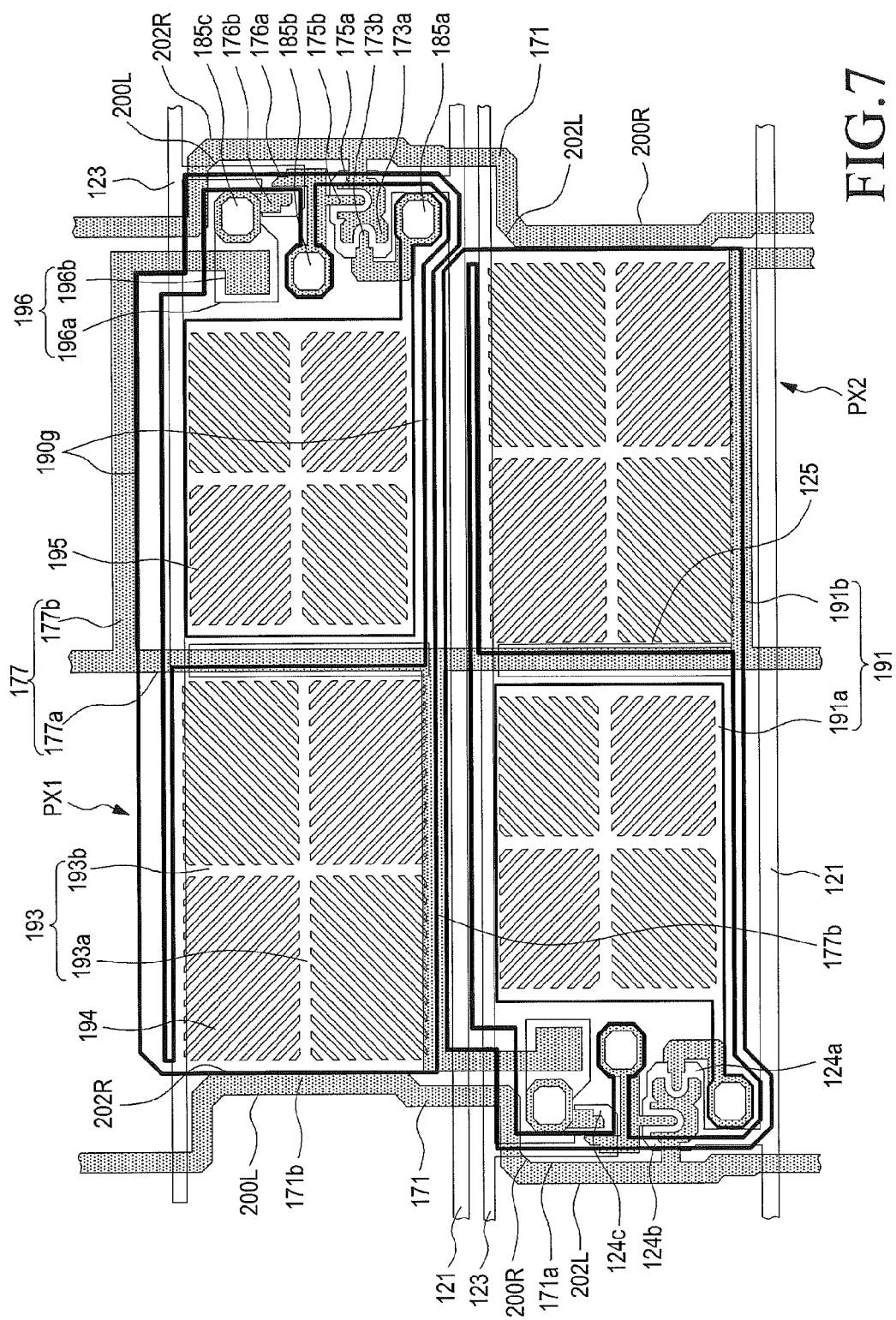
FIG. 7 is a plan view of an exemplary embodiment of upper and lower pixels in the liquid crystal display device shown in FIG. 6.

FIG. 7 is a plan view of an exemplary embodiment of adjacent upper and lower pixels in the liquid crystal display device shown in FIG. 6. Although, for convenience of description, FIG. 7 shows that two adjacent data lines 171 each having a longitudinal axis extending in the direction of a column (e.g., vertical in FIG. 7), two adjacent gate lines 121 each having a longitudinal axis extending in the direction of a row (e.g., horizontal in FIG. 7), and two pixels PX1 and PX2 arranged between the data lines 171 and between the gate lines 121, or arranged near intersections between the gate lines 121 and the data lines 171, it should be noted that a plurality of pixels PX may be arranged in the form of a matrix of rows and columns between a plurality of gate lines 121 and between a plurality of data lines 171.

While the exemplary embodiment of the liquid crystal display device shown in FIGS. 2, 3A and 3B corresponds to the equivalent circuit diagram in FIG. 1, the exemplary embodiment of the liquid crystal display device shown FIG. 7 corresponds to the equivalent circuit diagram in FIG. 6. In other words, the liquid crystal display device shown FIG. 7 is different from the liquid crystal display device shown in FIGS. 2, 3A and 3B in that the exemplary embodiment of the liquid crystal display device in FIG. 7 includes the charge sharing capacitor CS and the post-stage gate line GLn+1 for turning on the third switching element Qc as shown in FIG. 6. Therefore, like reference numerals denote like elements, so the same elements will not be described to avoid repetitive description thereof.

A first gate electrode 124a, a first source electrode 173a and a first drain electrode 173b form a first TFT Qa in FIG. 6 together with a first semiconductor layer (not shown). A second gate electrode 124b, a second source electrode 175a and a second drain electrode 175b form a second TFT Qb together with a second semiconductor layer (not shown). A third gate electrode 124c, a third source electrode 176a and a third drain electrode 176b form a third TFT Qc together with a third semiconductor layer (not shown).

Post-stage gate lines 123 each have a longitudinal axis extending in parallel to the gate lines 121, and pixel electrodes 191 are situated between the gate lines 121 and the post-stage gate lines 123, respectively, such as being between a gate line and a post-stage gate line 123. Each post-stage gate line 123 is connected to the third gate electrode 124c. As illustrated in FIG. 7, the third gate electrode 124c continuously extends from the post-stage gate line 123 such that the third gate electrode 124c and the post-stage gate line 123 are a single, unitary indivisible member. An N-th gate signal is applied to each gate line 121, and an (N+1)-th gate signal is applied to each post-stage gate line 123. The same signal as the gate signal applied to the gate line 121 of the lower pixel PX2 is applied to the post-stage gate line 123 of the upper pixel PX1.

Light blocking films 125 are situated in a boundary area between adjacent first and second subpixel electrodes 191a and 191b which are between the respective post-stage lines 123 and gate lines 121.

The first electrode 196a of the charge sharing capacitor CS in FIG. 6 is electrically connected to the third drain electrode 176b via a third contact hole 185c. The first electrode 196a may include a same material and be on and/or in a same layer as the pixel electrode 191. The second electrode 196b of the charge sharing capacitor CS in FIG. 6 overlaps the first electrode 196a.

Although not shown, a gate insulating film and a passivation layer are disposed between the first and second electrodes 196a and 196b as shown in FIGS. 3A and 3B. The first and second electrodes 196a and 196b constitute the charge sharing capacitor CS 196 with a gate insulating film and a passivation layer interposed therebetween. A portion of the passivation layer disposed between the first and second electrodes 196a and 196b may be omitted depending on the capacity of the charge sharing capacitor 196.

The charge sharing capacitor CS, third TFT Qc, second TFT Qb and first TFT Qa are sequentially situated along the data line 171 starting from a top of concave portion 202R or 200L. The first and second TFTs Qa and Qb may be situated almost parallel to each other, such that the first and second TFTs Qa and Qb may be substantially adjacent to teach other in the direction of a row (e.g., horizontal in FIG. 7).

Electron devices such as the first, second and third TFTs Qa, Qb and Qc and the charge sharing capacitor CS are disposed alternately in adjacent upper and lower pixels PX1 and PX2 along the direction of a column (e.g., vertical in FIG. 7). In other words, while the electron devices are disposed on the right-hand side of a pixel in the upper pixel PX1, the electron devices are disposed on the left-hand side of the pixel in the lower pixel PX2.

Reference voltage lines 177 include horizontal portions 177b connected to the charge sharing capacitor 196, and vertical portions 177a extending to pass through a boundary area between the adjacent first and second subpixel electrodes 191a and 191b of the adjacent upper and lower pixels PX1 and PX2. The horizontal portions 177b are electrically and physically connected to the second electrodes 196b of the charge sharing capacitor 196. As illustrated in FIG. 7, for example, the second electrodes 196b continuously extend from the horizontal portions 177b such that the second electrodes 196b and the reference voltage lines 177 are a single, unitary indivisible member. The reference voltage lines 177 may include a same material and be on and/or in a same layer as the second electrodes 196b.

The horizontal portions 177b extend from the vertical portion 177a and are alternately disposed in the upper and lower pixels PX1 and PX2. In other words, while the horizontal portion 177b extends from the vertical portion 177a toward the right direction in the upper pixel PX1, the horizontal portion 177b extends from the vertical portion 177a toward the left direction in the lower pixel PX2.

The pixel electrode 191 and the upper display panel (not shown) of the liquid crystal display device in the exemplary embodiment of FIGS. 6 and 7 are the same as the pixel electrode 191 and the upper display panel 200 of the exemplary embodiment of the liquid crystal display device shown in FIGS. 2, 3A and 3B. The reference voltage lines 177 may be between the first and second subpixel electrodes 191a and 191b adjacent in the row direction, in areas excluding micro slits 195 and micro branches 194, and between the upper and lower adjacent pixels PX1 and PX2 adjacent in the column direction.

The first and second subpixel electrodes 191a and 191b receive data voltages from the first and second drain electrodes 173b and 175b, respectively. If a gate signal is applied to the third gate electrode 124c via the post-stage gate line 123, the data voltage applied to the second subpixel electrode 191b undergoes voltage division by the third source electrode 176a. As a result, the voltage applied to the second subpixel electrode 191b may be lower in level than the voltage applied to the first subpixel electrode 191a.

The first and second subpixel electrodes 191a and 191b, which have received the data voltages, generate an electric field together with the common electrode 270 of the upper display panel, which, although not shown, has received the common voltage, thereby determining a direction of liquid crystal molecules 31 in a liquid crystal layer 3 between the pixel electrode 191 and the common electrode 270.

Sides or edges of micro branches 194 of the subpixel electrodes 191a and 191b make horizontal direction components perpendicular to the sides of the micro branches 194 by distorting the electric field, and a tilted direction of the liquid crystal molecules 31 is determined as a direction that is determined based on the horizontal direction components. Therefore, the liquid crystal molecules 31 first tend to be tilted in a direction perpendicular to the sides of the micro branches 194. However, because the horizontal direction components of the electric field by the sides of adjacent micro branches 194 have opposite directions and a gap between the micro branches 194 is narrow, liquid crystal molecules 31 tending to be tilted in the opposite directions may be tilted together in a direction parallel to a longitudinal axis direction of the micro branches 194.

However, liquid crystal molecules located in specific areas (e.g., side areas of the connection portion 190g and corner areas of the pixel electrodes 191) are not tilted in the direction parallel to the longitudinal axis direction of the micro branches 194. The liquid crystal molecules 31 in these areas may not contribute to improvement of luminance because of the low transmittance of light, compared to those in the areas where the liquid crystal molecules 31 are tilted in a predetermined direction (e.g., a direction parallel to the longitudinal axis direction of the micro branches 194). These areas are called non-transmission areas.

In accordance with one or more exemplary embodiments, the reference voltage line 177 may maximize the transmittance of pixels PX as the reference voltage line 177 is in non-transmission areas. Referring to FIG. 7, for example, the vertical portion 177a of the reference voltage line 177 may overlap the boundary area between the first and second subpixel electrodes 191a and 191b adjacent in the direction of the row, and may overlap sides or edges of the adjacent subpixel electrodes 191a and 191b. The vertical portion 177a may be disposed to overlap a light blocking film 125. The horizontal portion 177b electrically connected to the lower pixel PX2 may be situated between the pixel electrode 191 of the upper pixel PX1 and the gate line 121 connected to the upper pixel PX1. The horizontal portion 177b electrically connected to the lower pixel PX2 may partially overlap one side of the second subpixel electrode 191b of the upper pixel PX1. The horizontal portion 177b electrically connected to the lower pixel PX2 is parallel to at least part of the gate line 121 and the connection portion 190g.

The vertical portion 177a of the reference voltage line 177 is situated in the boundary area between the first and second subpixel electrodes 191a and 191b adjacent in the row direction, passing through the pixels PX adjacent in the direction of the column without being adjacent to the data line 171, thus reducing possible electrical short defects between the data line 171 and the reference voltage line 177, compared to the case where the vertical portion 177a is situated adjacent to the data line 171.

The characteristics of the exemplary embodiment of the liquid crystal display device shown in FIGS. 2, 3A and 3B may be applied to the exemplary embodiment of the liquid crystal display device shown in FIG. 7. Conversely, the characteristics of the exemplary embodiment of the liquid crystal display device shown in FIG. 7 may be applied to the exemplary embodiment of the liquid crystal display device shown in FIGS. 2, 3A and 3B.

As is apparent from the foregoing description, according to one or more exemplary embodiments of the invention, a reference voltage line connected to a voltage-dividing switching element for adjusting a voltage level of a low subpixel to which is applied a relatively low voltage, may be properly disposed to improve electrical short defects between a data line and the reference voltage line, thereby contributing to maximization of the transmittance and improvement of the visibility.

While the invention has been shown and described with reference to certain exemplary embodiments thereof, it will be understood by those skilled in the art that various changes in form and details may be made therein without departing from the spirit and scope of the invention as defined by the appended claims and their equivalents.

What is claimed is:

1. A liquid crystal display device comprising:
   an upper pixel, and a lower pixel adjacent to the upper pixel;
   gate lines in electrical connection with the upper pixel and the lower pixel, wherein the gate lines extend in a row direction;
   data lines which cross the gate lines; and
   a reference voltage line including a vertical portion which passes through the upper pixel and the lower pixel, and horizontal portions which alternately extend from the vertical portion;
   each of the upper pixel and the lower pixel including:
      first and second thin film transistors each in electrical connection with a gate line and a data line which correspond to a respective pixel; and
      a pixel electrode including a first subpixel electrode in connection with an output terminal of the first thin film transistor, and a second subpixel electrode in connection with an output terminal of the second thin film transistor;
      wherein the horizontal portions of the reference voltage line are in electrical connection with the second subpixel electrodes of both the upper pixel and the lower pixel.

2. The liquid crystal display device of claim 1, wherein the reference voltage line overlaps a portion of a non-transmission area of the upper pixel and the lower pixel.

3. The liquid crystal display device of claim 2, wherein a horizontal portion of the reference voltage line in electrical connection with the lower pixel extends along a horizontal side of the pixel electrode of the upper pixel.

4. The liquid crystal display device of claim 3, wherein the horizontal portion partially overlaps the pixel electrode of the upper pixel.

5. The liquid crystal display device of claim 4, wherein the vertical portion of the reference voltage line overlaps a portion of a boundary area between the first and second subpixel electrodes.

6. The liquid crystal display device of claim 4, wherein
   the first subpixel electrode has a 'V' shape, and
   the vertical portion of the reference voltage line overlaps a vertex of the 'V' shape.

7. The liquid crystal display device of claim 2, further comprising a light blocking film which overlaps the vertical portion of the reference voltage line, wherein the light blocking film is on a same layer as the gate line.

8. The liquid crystal display device of claim 2, further comprising a third thin film transistor in electrical connection between the output terminal of the second thin film transistor and the reference voltage line, wherein the third thin film transistor divides a voltage of the output terminal of the second thin film transistor.

9. The liquid crystal display device of claim 8, further comprising a charge sharing capacitor in electrical connection between the third thin film transistor and the reference voltage line.

10. The liquid crystal display device of claim 9, wherein the vertical portion of the reference voltage line overlaps a portion of a boundary area between the first and second subpixel electrodes.

11. The liquid crystal display device of claim 1, wherein the vertical portion of the reference voltage line overlaps a portion of a boundary area between the first and second subpixel electrodes.

12. The liquid crystal display device of claim 1, wherein
   the first subpixel electrode includes an incision portion which divides the first subpixel electrode into a first area and a second area, and
   the vertical portion of the reference voltage line overlaps a portion of the incision portion of the first subpixel electrode.

13. A display device comprising:
   a substrate;
   a pixel on the substrate;
   a gate line in electrical connection with the pixel, wherein the gate line extends in a row direction;
   a data line which crosses the gate line;
   the pixel including:
      first and second thin film transistors, each in electrical connection with the gate line and the data line; and
      a pixel electrode including a first subpixel electrode in connection with an output terminal of the first thin film transistor, and a second subpixel electrode in connection with an output terminal of the second thin film transistor, wherein a horizontal side of the pixel electrode in the row direction is longer than a vertical side of the pixel electrode; and
   a reference voltage line including:
      a vertical portion which passes through an area including the pixel electrode, and
      a horizontal portion which extends from the vertical portion along a perimeter of the horizontal side of the pixel electrode, wherein the horizontal portion is in electrical connection with the second subpixel electrode.

14. The display device of claim 13, wherein the reference voltage line overlaps a portion of a non-transmission area of the pixel.

15. The display device of claim 14, further comprising a light blocking film which overlaps the vertical portion of the reference voltage line, wherein the light blocking film is on a same layer as the gate line.

16. The display device of claim 14, wherein the vertical portion of the reference voltage line overlaps a portion of a boundary area between the first and second subpixel electrodes.

17. The display device of claim 14, wherein
   the first subpixel electrode includes an incision portion which divides the first subpixel electrode into first and second areas, and
   the vertical portion of the reference voltage line overlaps a portion of the incision portion of the first subpixel electrode.

18. The display device of claim 14, further comprising a third thin film transistor in electrical connection between the output terminal of the second thin film transistor and the reference voltage line, wherein the third thin film transistor divides a voltage of the output terminal of the second thin film transistor.

19. The display device of claim 18, further comprising a charge sharing capacitor in electrical connection between the third thin film transistor and the reference voltage line.

20. A liquid crystal display device comprising:
a first substrate;
a second substrate which faces the first substrate;
a liquid crystal layer between the first substrate and the second substrate, and including liquid crystal molecules;
a plurality of gate lines on the first substrate, wherein the plurality of gate lines extends in a row direction;
a plurality of data lines on a first insulating layer which is on the first substrate, wherein the plurality of data lines extends in a column direction;
pixel electrodes on a second insulating layer which is on the first insulating layer,
wherein the pixel electrodes are respectively between adjacent gate lines among the plurality of gate lines and between adjacent data lines among the plurality of data lines, each of the pixel electrodes including first and second-area electrodes;
switching elements which alternately connect pixel electrodes in a same row to the data lines adjacent to the pixel electrodes in the same row,
wherein each of the switching elements includes at least two thin film transistors, sources and gates of the thin film transistors are in connection with data lines and gate lines which correspond to the thin film transistors, respectively, and drains of the thin film transistors are in connection with the first and second-area electrodes which correspond to the thin film transistors, respectively;
a reference voltage line on the second insulating layer,
wherein the reference voltage line includes vertical lines which extend in the column direction and in predetermined areas of the pixel electrodes, and horizontal lines in connection with the second-area electrodes along perimeters between the pixel electrodes, wherein the horizontal lines alternately extend in the row direction from the vertical lines; and
a common electrode which faces the pixel electrodes and is on the second substrate.

21. The liquid crystal display device of claim 20, wherein the first and second-area electrodes each have a 'V' shape, and
the predetermined areas of the pixel electrodes include a vertex of the 'V' shape of the first and second-area electrodes.

22. The liquid crystal display device of claim 20, wherein the predetermined areas of the pixel electrodes are areas of separation between the first and second-area electrodes.

23. A liquid crystal display device comprising:
a first substrate;
a second substrate which faces the first substrate;
a liquid crystal layer between the first and second substrates, and including liquid crystal molecules;
a plurality of gate lines on the first substrate, wherein the plurality of gate lines extends in a row direction;
a plurality of data lines on a first insulating layer which is on the first substrate, wherein the plurality of data lines extends in a column direction;
pixel electrodes on a second insulating layer which is on the first insulting layer,
wherein the pixel electrodes are respectively between adjacent gate lines among the plurality of gate lines and between adjacent data lines among the plurality of data lines, a horizontal side of the pixel electrodes in the row direction is longer than a vertical side of the pixel electrodes in the column direction, and each of the pixel electrodes includes first and second-area electrodes;
switching elements which connect pixel electrodes in a same row to the data lines adjacent to the pixel electrodes in the same row,
wherein each of the switching elements includes at least two thin film transistors, sources and gates of the thin film transistors are in connection with data lines and gate lines corresponding to the thin film transistors, respectively, and drains of the thin film transistors are in connection with the first and second-area electrodes corresponding to the thin film transistors, respectively;
a reference voltage line on the second insulating layer,
wherein the reference voltage line includes vertical lines which extend in the column direction and in predetermined areas of the pixel electrodes, and horizontal lines in connection with the second-area electrodes along perimeters between the pixel electrodes, wherein the horizontal lines extend in the row direction; and
a common electrode which faces the pixel electrodes and is on the second substrate.

24. A display device comprising:
a substrate;
a pixel on the substrate;
a gate line in electrical connection with the pixel, wherein the gate line extends in a row direction;
a data line which crosses the gate line;
the pixel including:
  first and second thin film transistors in electrical connection with the gate line and the data line; and
  a pixel electrode including a first subpixel electrode in connection with an output terminal of the first thin film transistor, and a second subpixel electrode in connection with an output terminal of the second thin film transistor; and
a reference voltage line including:
  a vertical portion which passes through an area including the pixel electrode,
  a first horizontal portion which extends from the vertical portion in a first direction in the row direction, wherein the first horizontal portion is in electrical connection with the second subpixel electrode, and
  a second horizontal portion which extends in a direction opposite to the first direction.

* * * * *